(12) United States Patent
Hsieh

(10) Patent No.: US 6,323,749 B1
(45) Date of Patent: Nov. 27, 2001

(54) MRI WITH SUPERCONDUCTING COIL

(75) Inventor: Hank Hsieh, Berkeley, CA (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/363,179

(22) Filed: Jul. 29, 1999

Related U.S. Application Data

(60) Provisional application No. 60/094,520, filed on Jul. 29, 1998.

(51) Int. Cl.[7] .................................................. H01F 5/00
(52) U.S. Cl. ........................ 335/299; 335/216; 335/300
(58) Field of Search .......................... 335/216, 297–8, 335/300, 301; 324/318–321; 505/892–8; 62/51.1

(56) References Cited

U.S. PATENT DOCUMENTS

| | | | |
|---|---|---|---|
| 4,672,346 | 6/1987 | Miyamoto et al. | 335/296 |
| 4,766,378 * | 8/1988 | Danby et al. | 335/216 |
| 4,924,198 * | 5/1990 | Laskaris | 335/216 |
| 5,138,326 | 8/1992 | Edwards et al. | 324/319 |
| 5,381,122 * | 1/1995 | Laskaris et al. | 335/216 |
| 5,754,085 * | 5/1998 | Danby et al. | 335/297 |
| 5,884,489 | 3/1999 | Retz et al. | 62/51.1 |

OTHER PUBLICATIONS

Magnetic Resonance Imaging System Brochure, Toshiba Corporation, 1997. No Month.

* cited by examiner

*Primary Examiner*—Lincoln Donovan
(74) *Attorney, Agent, or Firm*—Lerner, David, Littenberg, Krumholz & Mentlik, LLP

(57) ABSTRACT

A magnetic resonance imaging magnet for examining a patient comprises ferromagnetic pole pieces defining a patient-receiving gap for examining a patient. Coil assemblies for producing a magnetic field include at least one coil mounted adjacent to at least one thermally conductive member.

20 Claims, 7 Drawing Sheets

MRI WITH SUPERCONDUCTING COIL

CROSS REFERENCE TO RELATED APPLICATIONS

THIS APPLICATION CLAIMS BENEFIT OF U.S. PROVISIONAL APPLICATION SERIAL NO. 60/094,520, FILED JUL. 29, 1998, THE DISCLOSURE OF WHICH IS HEREBY INCORPORATED BY REFERENCE HEREIN.

FIELD OF THE INVENTION

The present invention relates to superconducting magnetic resonance imaging ("MRI") devices for producing images used in medical diagnostics.

BACKGROUND OF THE INVENTION

Medical magnetic resonance studies are typically carried out in strong magnetic fields. In an electromagnet employing normal conductors, a portion of the electrical power used to generate the magnetic field is consumed in heating of the resistive coil conductor. Thus, many kilowatts of power may be required to produce the magnetic field strength for a volume sufficient to develop a magnetic resonance image for medical diagnostics.

A coil of a conductive material, which is wound into a solenoid, generates the magnetic field for the magnet. The use of superconducting coils in MRI systems greatly reduces the amount of power consumed since a superconductor has a resistance which approaches zero and thus does not expend as much power to produce the same magnetic field. One of the controlling factors in superconductivity is the critical temperature of the conductive material of the coil. In a typical superconducting MRI magnet, a cryogenic fluid is used to cool a superconducting coil to a temperature at or below the critical temperature so that the coil exhibits superconducting properties.

One type of MRI magnet incorporates a frame formed from a ferromagnetic material, disclosed in U.S. Pat. Nos. 4,766,378 and 5,754,085, the disclosures of which are hereby incorporated by reference herein.

The MRI magnet disclosed in certain embodiments of U.S. Pat. No. 5,754,085 includes a first superconducting coil assembly supported on an upper support and a second superconducting coil assembly supported on a lower support. Superconducting coil assemblies typically include a container for the superconducting coil and the coil is disposed inside the container and immersed in a bath of liquid helium held in the container.

A substantial field is created by the primary magnet assembly. The net forces acting on the coils results in attraction of the coils to each other or attraction between the individual coils and the adjacent ferromagnetic components. The direction and magnitude of the force depends on the location of the coils with respect to the median plane of the magnet. The forces created by the field tends to spread the coil in a radial direction, tending to unravel the coil, or causes the coils to be attracted to the adjacent ferromagnetic structure. Thus, mounting and supporting the superconducting coils within an MRI magnet is a substantial problem. In addition, one of the issues which must be addressed is the tendency of the support structure for the superconducting coil to add heat to the coil by conduction from the outside environment.

The cryogenic fluid utilized to cool a superconducting coil is costly, which is a drawback as compared to a non-superconducting electromagnet. An MRI magnet including support structure for the superconducting coil which minimizes the amount of heat introduced into the superconducting coil, and which utilizes a minimum amount of cryogenic fluid is desirable for reasons of operating cost. Moreover, it is desirable to minimize the amount of cryogenic fluid in proximity to the coil for other reasons. A superconducting magnet coil can become normally-conducting in certain unusual circumstances known as a "quench". When this happens, energy stored in the flowing current is dissipated rapidly, and the surrounding cryogenic liquid is converted to a gas. While a properly designed superconducting magnet should not quench, safety precautions should be provided to take into account possible quenching and gas evolution. With less cryogenic fluid in the superconducting coil assembly, this problem is minimized.

SUMMARY OF THE INVENTION

The present invention addresses these needs.

A magnetic resonance imaging magnet for examining a patient comprises a first ferromagnetic pole piece and a second ferromagnetic pole piece, the pole pieces being disposed facing each other and defining a patient-receiving gap therebetween. The pole pieces are arranged for producing a magnetic field within the patient-receiving gap and have a central axis extending through the pole pieces. The magnet also comprises a ferromagnetic yoke for supporting the first pole piece and the second pole piece in their respective positions facing each other. The magnet includes a first superconducting coil assembly and a second superconducting coil assembly. Each assembly has an insulated housing and is disposed adjacent one of the pole pieces for producing a magnetic field which passes through the pole pieces and the patient-receiving gap. Each coil assembly includes at least one coil encircling the associated pole piece, at least one thermally conductive member mounted adjacent to the at least one coil, and means for maintaining a cryogenic fluid. The at least one thermally conductive member is in heat transfer relationship with the cryogenic fluid, thereby maintaining the at least one coil at a temperature at which the at least one coil exhibits superconducting properties.

The superconducting coil is cooled by conduction through the thermally conductive member which removes heat from the superconducting coil. The coil is not immersed in a cryogenic fluid such as helium so that the volume of helium required in the superconducting coil assembly is reduced.

The ferromagnetic yoke preferably comprises a magnetic flux conduit to minimize leakage magnetic fields.

The superconducting coil assembly of the magnet also preferably includes a plurality of suspension members connected to the coil assembly for restraining the superconducting coil assembly. The substantial forces acting on the superconducting coil assembly when the coils are generating a magnetic field are counteracted by the plurality of suspension members. The suspension members carry less heat to the superconducting coil assembly than a compression-type mounting having a greater cross-sectional area. However, a compression-type mounting may be used in some embodiments of the invention. Accordingly, the superconducting coil assembly may include a plurality of supporting legs connected to the ferromagnetic yoke for supporting the superconducting coil assembly within the magnet.

In preferred embodiments, the housing for the superconducting coil assembly includes at least one layer of super-insulation surrounding the at least one coil. The housing may also include at least one heat shield within the housing. The heat shield or shields must be optimized to reduce the heat transfer from the hot environment to the cold mass. In certain preferred embodiments, the housing may enclose an inner anti-buckling ring, an outer clamping ring, a top support ring and a bottom support ring for supporting the at least one coil and restraining the at least one coil in the coil assembly. The coil assembly preferably includes a housing having a toroidal shape and being arranged concentrically with the central axis.

In certain preferred embodiments, the magnet includes a first support for supporting and restraining the at least one coil adjacent the at least one thermally conductive member, the first support having a U-shaped cross section. The first support may have any number of cross-sectional shapes. A second housing is preferably included for mounting the at least one thermally conductive member adjacent the at least one coil, the second support having a U-shaped cross-section. The second support also may have a number of cross-sectional shapes.

In preferred embodiments, the means for maintaining the cryogenic fluid for the magnet includes a cryocooler. The cryocooler preferably includes a cryogenic fluid. The at least one thermally conductive member may include at least one tube, carrying a p-cryogenic fluid. The at least one tube may comprise three tubes, for example, depending on the size of the coil. The means for maintaining the cryogenic fluid preferably comprises a cryocooler, re-condensing the cryogenic fluid to a liquid phase, connected to the at least one tube. The cryogenic fluid preferably comprises liquid helium.

The at least one thermally conductive member, in certain preferred embodiments, comprises at least one strap of a thermally conductive metal, such as high purity aluminum. Preferably, the thermally conductive metal comprises aluminum having a purity of at least 99%.

A superconducting coil assembly for a magnetic resonance imaging magnet for examining a patient in accordance with the above is also provided in another aspect of the present invention. In a further aspect of the present invention, a superconducting coil assembly comprises an insulated vessel having a toroidal shape and a central axis extending therethrough, a coil subassembly having a first side and a second side and at least one superconducting coil. The superconducting coil assembly includes a plurality of suspension members extending parallel to the central axis, into the vessel, for supporting the superconducting coil assembly in a magnetic resonance imaging magnet. The suspension members are arranged in pairs so that one suspension member is connected to the subassembly at the first side and another suspension member is connected to the subassembly at the second side.

In preferred embodiments, the plurality of suspension members include suspension members extending through the housing from a top end to a bottom end of the housing and having termini connected to the bottom end.

BRIEF DESCRIPTION OF THE DRAWINGS

Additional objects and features of the invention will appear from the following description of the preferred embodiments of the invention in conjunction with the accompanying drawings, in which.

DETAILED DESCRIPTION OF THE PREFERRED EMBODIMENTS

Figure 1:
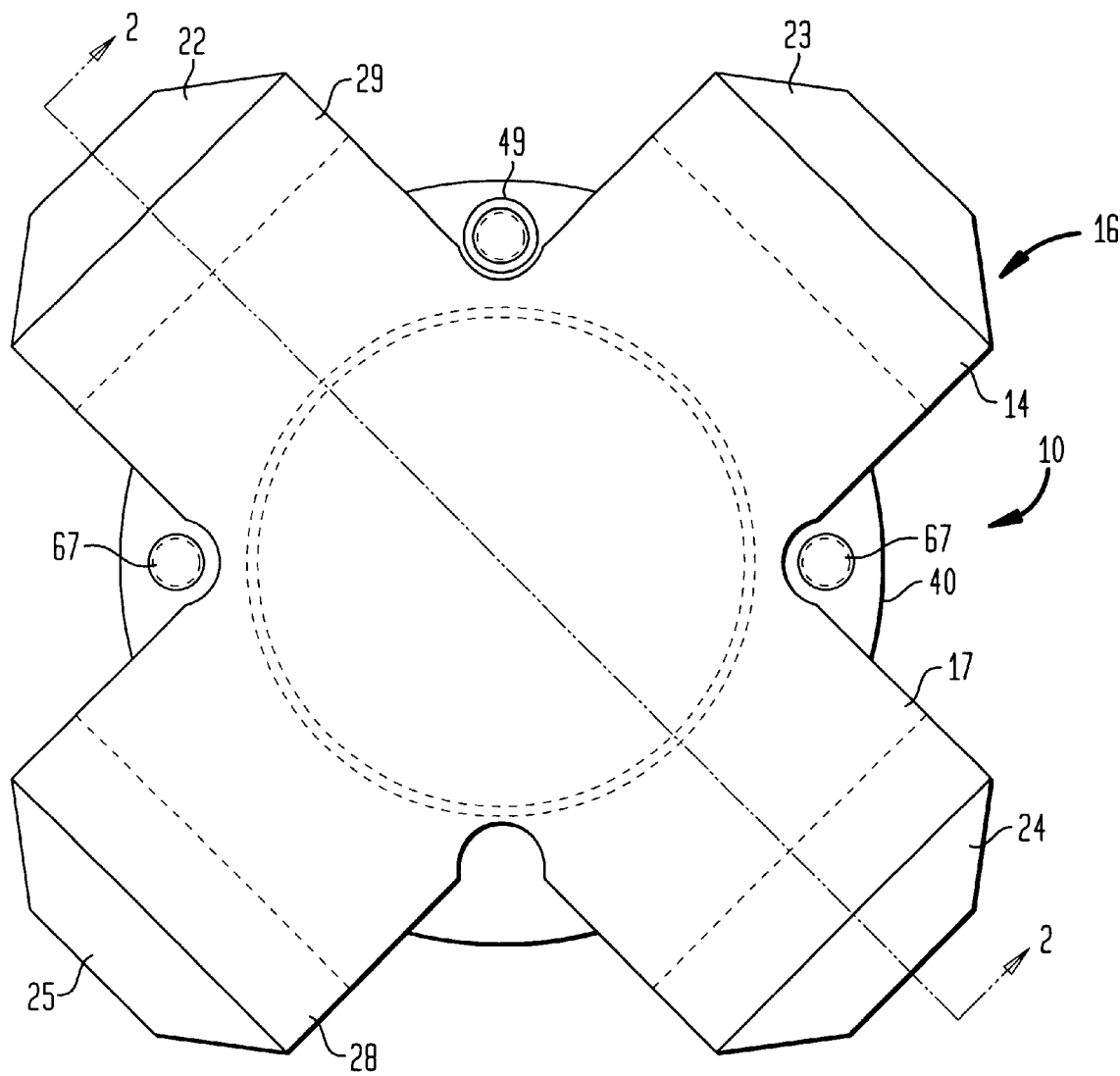
FIG. 1 is a top plan view of an MRI magnet in accordance with a first embodiment of the present invention.

A magnetic resonance imaging ("MRI") magnet for examining a patient in accordance with an embodiment of the invention is depicted in FIGS. 1–5. The MRI magnet includes a first ferromagnetic pole piece 11 and a second ferromagnetic pole piece 12 disposed facing each other and defining a patient-receiving gap 13 therebetween. The first pole piece 11 and second pole piece 12 have a common central axis 15 extending through the patient-receiving gap 13. The MRI magnet also includes a first pole stem 19 connected to first pole piece 11 and a second pole stem 21 connected to second pole piece 12. In preferred embodiments, the pole stems each comprise a plurality of smaller stem elements. The pole stem or pole stem elements are preferably cylindrical.

Figure 2:
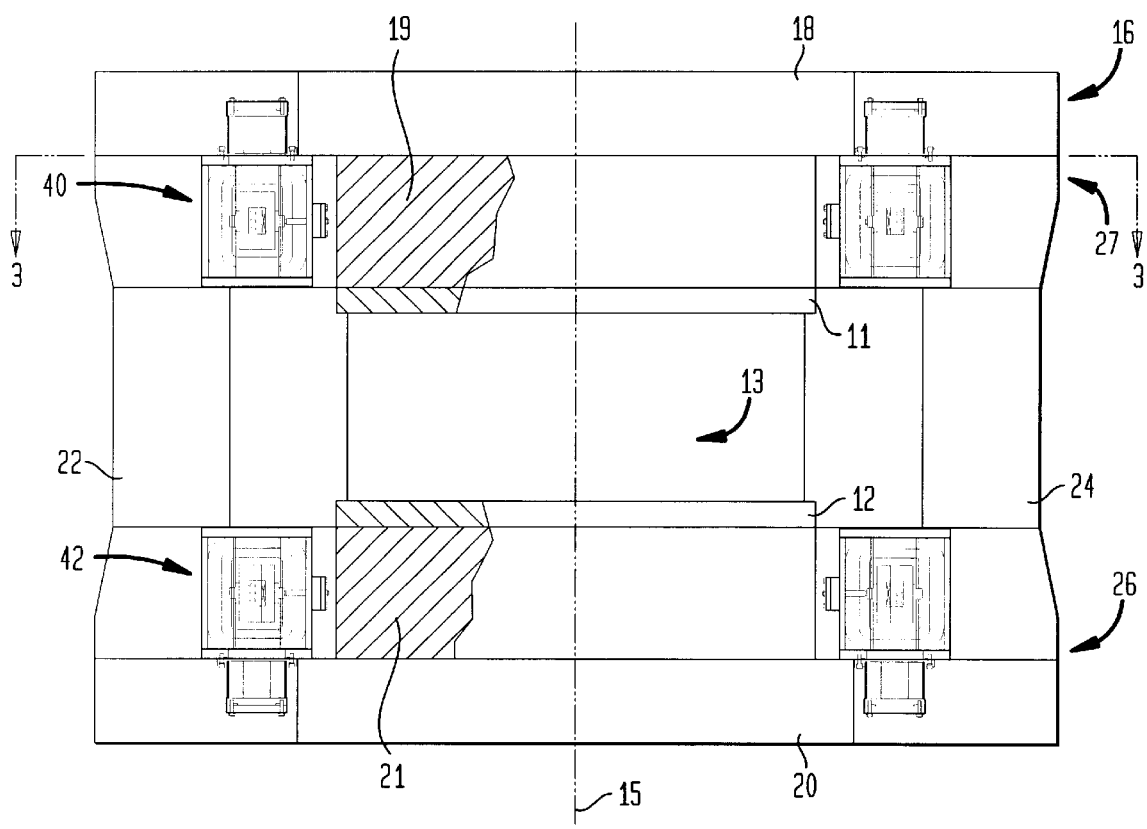
FIG. 2 is a schematic sectional view taken along line 2—2 in FIG. 1.

A ferromagnetic yoke 16 supports the first pole piece and second pole piece in their respective positions facing each other. As best seen in FIGS. 1 and 2, the ferromagnetic yoke 16 includes an upper support 18 to which pole stem 19 is connected and a lower support 20 to which pole stem 21 is connected. The upper support 18 and the lower support 20 comprise a cross-shaped member having radially extending extensions. A plurality of columns, preferably 4 columns, are equally spaced around the central axis 15. The columns 22, 23, 24 and 25 are connected to extensions 29, 14, 17 and 28, respectively, and radially spaced from the patient-receiving gap. The columns are connected to the lower support in a similar manner. The upper support 18 is connected to upper ends 27 of the columns 22, 23, 24 and 25 and the lower support 20 is connected to lower ends 26 of the columns 22, 23, 24 and 25. Thus, the upper support 18 is connected to the pole stem 19, which is connected to pole piece 11, which is disposed above the patient-receiving gap. Lower support 20 is connected to pole stem 21, which is connected to pole piece 12, which is disposed below the patient-receiving gap.

A first coil assembly 40 is connected to the upper support 18 and a second coil assembly 42 is connected to the lower support 20.

The ferromagnetic yoke is preferably constructed in accordance with U.S. Pat. No. 5,754,085, the disclosure of which is hereby incorporated by reference herein. The ferromagnetic yoke of U.S. Pat. No. 5,754,085 is constructed so as to control the magnetic flux within the supporting structure for the magnet to minimize leakage magnetic fields, and to create the strong magnetic field necessary for diagnostics imaging, and provide a comfortable space in which the patient can lie. Alternatively, the ferromagnetic frame of U.S. Pat. No. 4,766,378, the disclosure of which is hereby incorporated by reference herein, may also be used to support the first coil assembly 30 and the second coil assembly 37.

Figure 3:
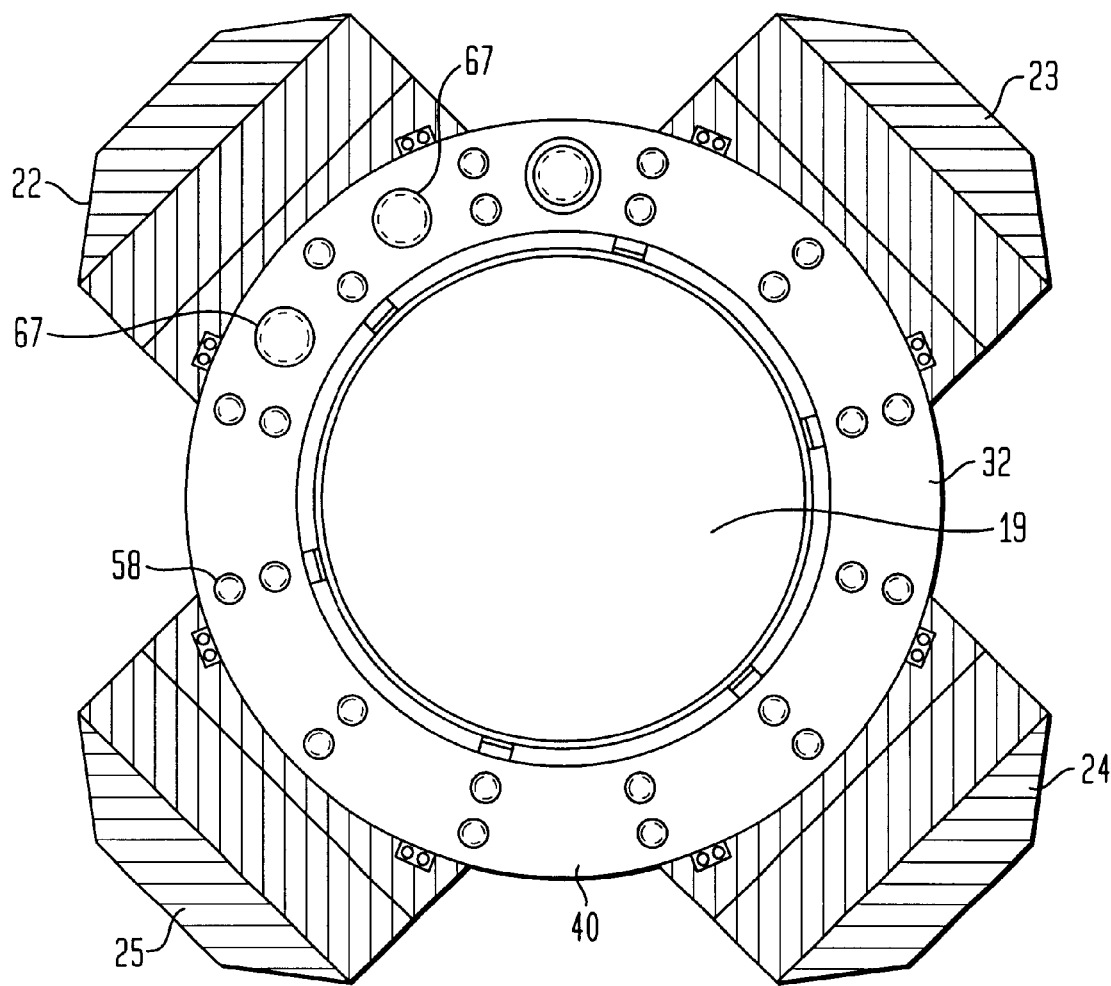
FIG. 3 is a sectional view taken along line 3—3 in FIG. 2.

As best seen in FIG. 3, first coil assembly 40 has a housing 32 having a toroidal shape surrounding pole stem 19 so that the housing 32 is concentrically arranged with pole stem 19 on the central axis 15. The second coil assembly 42 has a similarly arranged housing adjacent to and concentrically arranged with pole stem 21 on central axis 15.

Figure 4:
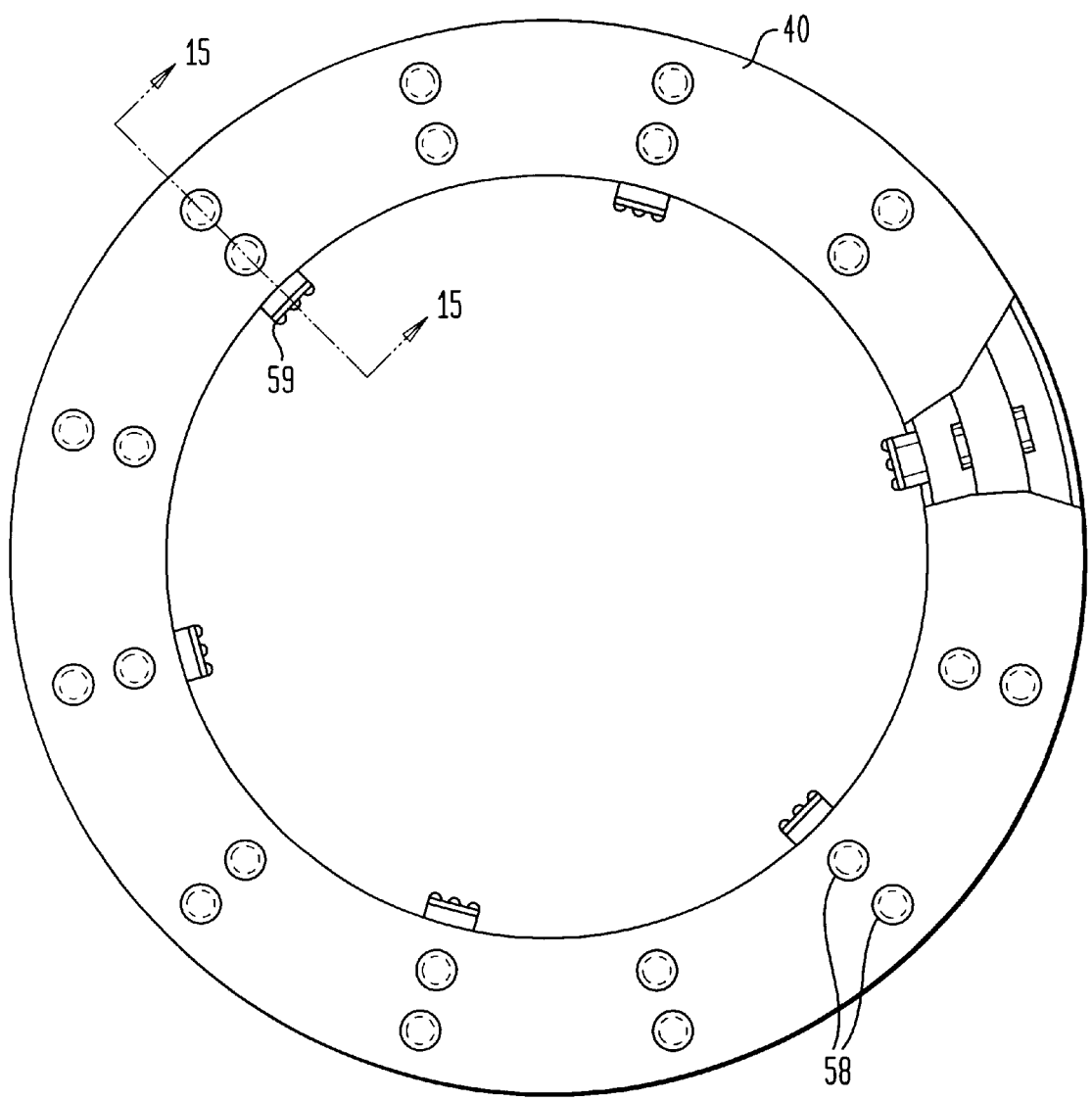
FIG. 4 is a plan view, partially in section, of the coil assembly of the embodiment of FIGS. 1–3.
Figure 5:
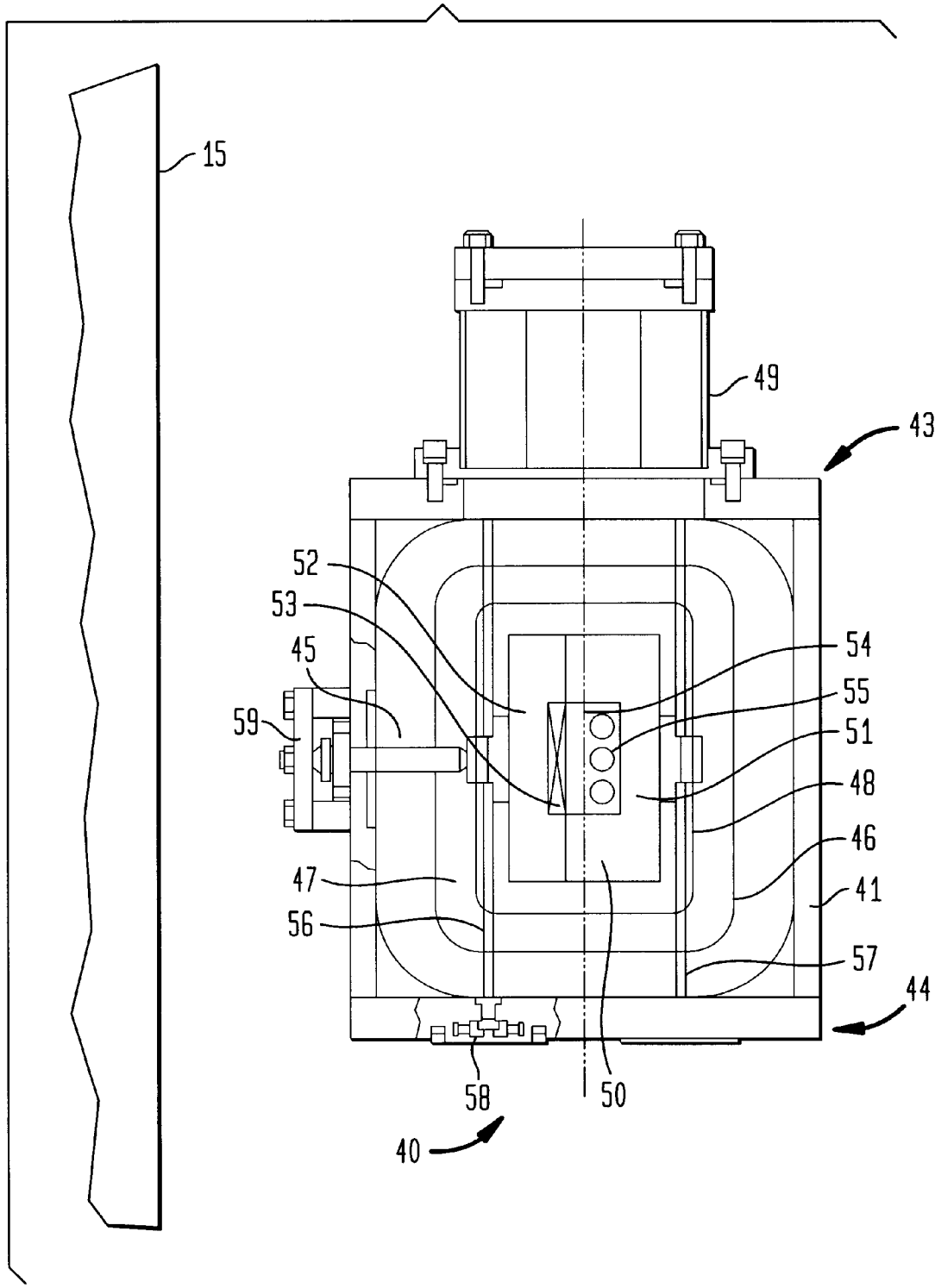
FIG. 5 is a sectional view, taken along line 5—5 in FIG. 4, showing a superconducting coil assembly in accordance with the embodiment of the invention in FIGS. 1–4.

As best seen in FIGS. 4 and 5, the superconducting coil assemblies are mounted adjacent the pole stems so that, when the coils are energized with an electric current, magnetic flux flows through the pole stems and into the pole pieces, creating a magnetic field between the pole pieces in the patient-receiving gap. The first superconducting coil assembly 40 includes a vacuum-tight vessel 41, preferably formed from a non-magnetic metal, such as aluminum, or non-magnetic stainless steel. The vessel may be comprised of side plates 30 and 31, top plate 33 and bottom plate 34. The vessel 41 has a first end 43 including a flange for connecting to upper support 18. A second superconducting coil assembly 42 is constructed in the same manner as first superconducting coil assembly 40, except that second superconducting coil assembly 42 is connected to lower support 20, as best seen in FIG. 2.

The following description of the first superconducting coil assembly 40 applies equally to the second superconducting coil assembly 42. The vacuum-vessel 41 of first superconducting coil assembly 40 contains, as best seen in FIG. 5, a layer of superinsulation and heat shields surrounding a cold mass 50. A layer of superinsulation 45, surrounds a heat shield 46. The term "superinsulation", commonly used in the field of cryogenics, comprises a multilayered insulative material having low emissivity, such as metallized, reflective layers of thin polymer film. Adjacent the heat shield 46 is a space 47. The cold mass 50 is surrounded by another heat shield 48, which is separated from the heat shield 46 by the space 47. The heat shields must shield the cold mass 50 against heat up to an appropriate temperature. The heat shields will vary according to the particular application. In the particular embodiment of FIGS. 1–5, shield 46 is a 40° Kelvin shield and shield 48 is a 20° Kelvin heat shield. The spaces within the vacuum-vessel 41 are evacuated to a very low pressure to minimize any heat transfer due to convection. The cold mass 50 includes a "strongback" 51, or a U-shaped housing, in which a number of tubes containing a cryogenic fluid are mounted, and a coil bobbin 52, another U-shaped housing in which a superconducting coil 53 is wound and mounted. The strongback and coil bobbin may have a number of cross-sectional shapes. The strong back and coil bobbin are preferably comprised of stainless steel for strength. The coil bobbin 52 is adjacent the strongback 51, with the coil bobbin 52 on the inside of the coil, closest to axis 15. Thus, the coil encircles axis 15. Also included, between the coil 53 and tubes, is a member or hoop strap 54 in contact with the coil 53. The hoop strap 54, restrains the coil in the radial direction toward central axis 15 and provides thermally conductive contact between the coil 53 and the cryogenic fluid tubes 55. The coil bobbin 52 and strongback 51 may have a U-shaped cross section and may be arranged with their open sides facing each other, providing structural rigidity for the superconducting coil 53. The superconducting coil 53 is comprised of a superconductor wound to form a solenoid having a toroidal shape corresponding to the shape of the coil assembly.

The superconducting coil is not immersed in the cryogenic fluid, as in prior art superconducting MRI magnets. The superconducting coil assembly in accordance with this embodiment is compact and requires a relatively smaller volume of cryogenic fluid within the coil assembly.

Strong magnetic fields are commonly used for MRI magnet diagnostics, typically at least 1 kilogauss, and in some cases up to about 10 Kilogauss (1 TESLA) or more. This large magnetic field acts on the other components in the MRI magnet. The magnetic field generated by the superconducting coils exert substantial magnetic forces on the coils and the structure of the magnet, tending to pull the coils towards each other and tending to unravel each coil radially outwardly. The strongback 51, hoop strap 54, and coil bobbin 52 restrain the coil and maintain the coil shape.

The vacuum vessel 41 is comprised of relatively strong, top and bottom plates which have a toroidal shape, in addition to curvilinear side plates. These plates form the boundary of the vacuum vessel and the superinsulation and heat shields separate the cold mass 50 from the vacuum vessel plates. Thus, the heat loss through the plates is greatly reduced.

The superconducting coil assemblies must be securely connected to their respective upper support 18 or lower support 20 and must be restrained against their tendency to move. As shown in FIG. 5, a series of suspension rods arranged in pairs, such as suspension rods 56 and 57, are connected to the top and bottom plates of the vessel 41. The suspension rods may be comprised of a number of materials, such as stainless steel, titanium, fiberglass, and others. The service port 49 is connected to the top or bottom plate of the vacuum vessel. At a second end 44 of the superconducting coil assembly, tensioning devices 58 are mounted in the vacuum-vessel 41. The tensioning devices 58, as best seen in FIGS. 3, 4, and 5, are accessible on the first end and second end of the vessel 41 for pre-tensioning and adjusting the tension in the tension rods. A high thermal resistant bumper assembly 59 in the vacuum vessel 41 allows the position of the coil 53 to be adjusted and centered.

The superconducting coil may be comprised of a fully stabilized niobium, titanium superconductor. The coil may be provided with a conventional start switch. In the embodiment shown in FIG. 5, three cryogenic tubes 55, preferably carrying liquid helium, attached to the hoopstrap 54 of the cold mass 50. The cryogenic tubes 55 may comprise three tubes of a thermally conductive material. A number of thermally conductive materials may be used, preferably a thin-walled pipe of a thermally conductive material, such as high purity aluminum. Aluminum having a purity of at least about 99% is preferred. A service port 49 is located adjacent first end 43 of the superconducting coil assembly. Superinsulation surrounds the service port 49.

The MRI magnet also includes a cryocooler for re-condensing the cryogenic fluid to a liquid phase so that the coil may be cooled to a temperature at which the coil exhibits superconducting properties. As seen in FIG. 1, one type of cryocooler is included in the coil assembly and may include two cold heads 67. If two cold heads are used, the cold heads 67 cool the helium in two stages. For example, when two heat shields are used, one cold head may cool the cryogenic fluid to 20° Kelvin and the other may cool the cryogenic fluid to 4° Kelvin. The 20° Kelvin cold head is in communication with space 47 and the 4° Kelvin cold head is in communication with the cryogenic fluid tubes 55 discussed above. In the alternative, a cryocooler according to FIG. 6 may be used.

The superinsulation and heat shielding protect the cold mass from heat loads. Heat loads added to the cold mass 50 include those due to radiation and conduction between room temperature of the vacuum vessel plates and the cold mass 50, and heat loads added to the system through the support system for the superconducting coil assembly, which must be minimized. The suspension rod system of FIG. 5 is preferred to a compression mounting system such as that disclosed in U.S. Pat. No. 4,766,378, the disclosure of which is hereby incorporated by reference herein, because the suspension rod system utilizes a member passing into the cold space having a smaller cross-sectional area and longer in length than a comparable member in the compression mounting system. The suspension rods add less heat to the cold mass 50.

Figure 6:
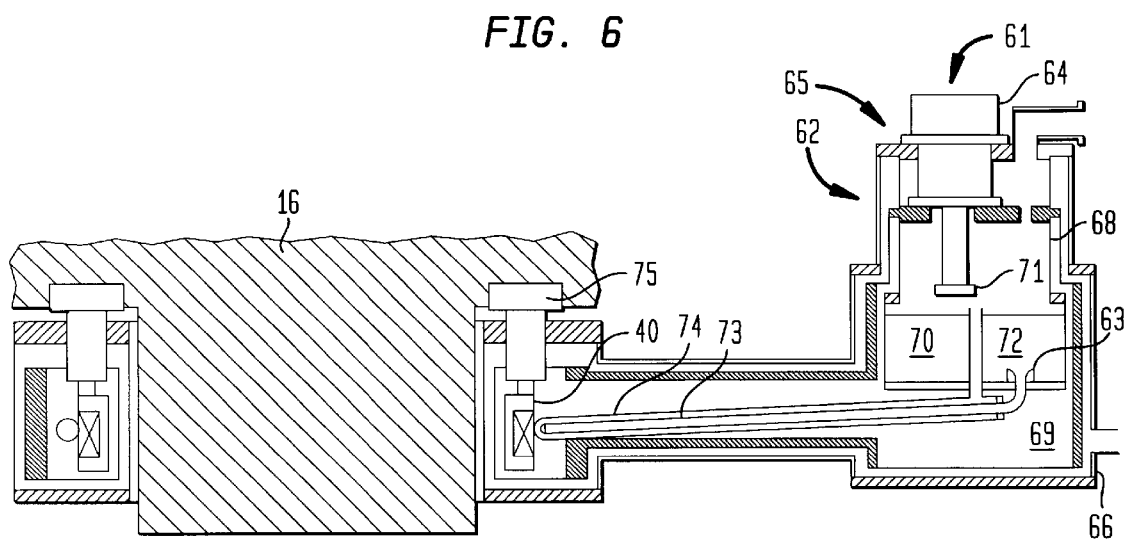
FIG. 6 is a partial cross-sectional view showing an upper coil assembly and cryocooler in accordance with another embodiment of the invention.

In certain preferred embodiments, the MRI magnet includes the cryocooler depicted in FIG. 6. The cryocooler 60 may comprise a Sumitomo RDK-415D cryocooler, which includes a closed cycle helium compressor, two high-pressure gas lines and a two-stage cold head.

The cryocooler 60 is included in the same housing as the coil assembly, but is separated from the superconducting coil assembly by an umbilical section and has a body 62 including a liquid cryogenic fluid vessel 63 mounted therein. A re-condensing cold head 64 is mounted at top end 65 of the body 62 and includes a vessel neck tube 68 for maintaining the cryogenic fluid. When the cryogenic fluid is re-condensed, the cryogenic fluid has a temperature approaching 4° Kelvin.

A bottom 69 of the vessel 63 is disposed adjacent a bottom end 66 of the body 62. Bottom 69 includes an inlet 71 and an outlet 72 for the cryogenic fluid 70. The outlet 72 is connected to a pipe 73 and inlet 71 is connected to return pipe 74. Feed pipe 73 and return pipe 74 extend from vessel 63 to a thermally conductive member, such as the cryogenic fluid tubes 55 discussed above. The thermally conductive member is located in conductive contact with the superconducting coil 53. The thermally conductive member cools the superconducting coil 53 to a temperature at which the superconducting coil exhibits superconducting properties.

The cryogenic fluid in the cryogenic fluid tubes is thereby heated and flows through return pipe 74 to vessel 63 to be cooled by the cold head 61. Also illustrated in FIG. 6 is a compression-type support 75 for the superconducting coil assembly 40. Alternatively, the coil assembly may include the cryocooler discussed above. As seen in FIG. 1, one or more cold heads 67 may be provided.

Figure 7:
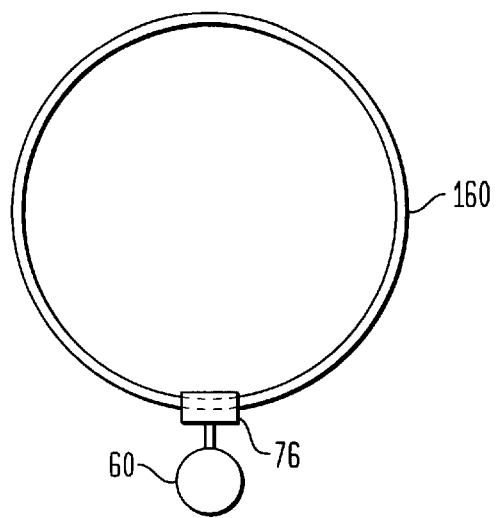
FIG. 7 is a partial cross-sectional view of a thermally conductive strap and cryocooler in accordance with yet another embodiment of the invention.
Figure 8:
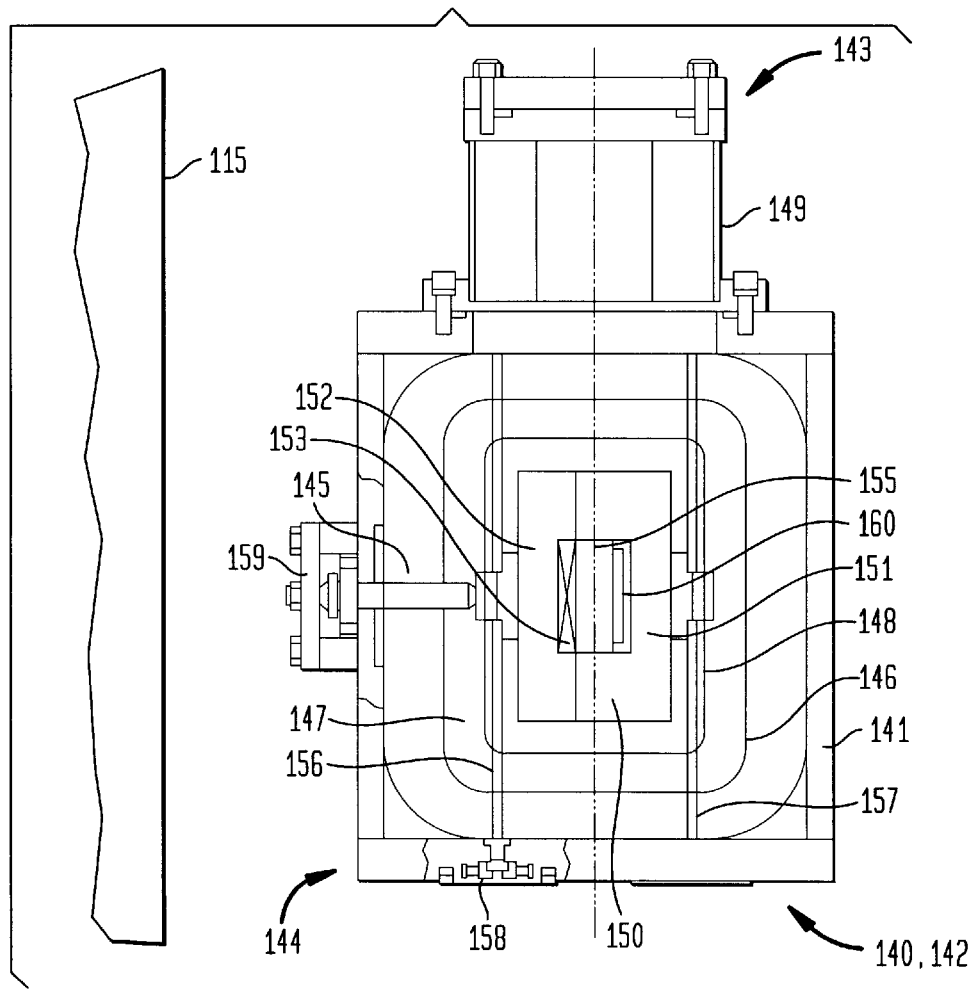
FIG. 8 is a sectional view showing a superconducting coil assembly in accordance the embodiment of FIG. 7.

A further embodiment of the invention is depicted in FIG. 8, showing the superconducting coil assemblies 140 and 142, which are substantially the same as the superconducting coil assemblies 40 and 42 discussed above in connection with FIG. 6, except as follows. The strongback 151 houses a thermally conductive member comprising a strap 160 comprised of a material having a high conductivity. High purity aluminum is preferred, although a number of thermally conductive materials may be utilized. The strap 160 is connected to a cryocooler. The cryocooler 60 sustains the strap 160 at a temperature sufficient to maintain the superconducting coil 153 at a temperature at which the superconducting coil exhibits superconducting properties. The strap 160 may extend to the cryocooler 60 shown in FIG. 6. The cryogenic fluid need not enter the superconducting coil assemblies 140 and 142 in this embodiment. The strap 160 may be immersed in cryogenic fluid in the cryocooler, as shown in FIG. 7. The strap 160 is immersed in liquid helium at helium space 76, at one point along the toroidal strap. The liquid helium space 76 is connected to cold head 61, shown schematically in FIG. 7. In the alternative, may be connected to a surface cooled by the cryogenic fluid.

Although the present invention has been described in considerable detail with reference to certain preferred embodiments thereof, other versions are possible. For example, the superconducting coil assemblies of FIGS. 5 and 8 may include the compression-type mounting discussed above. In addition, other cryocoolers may be utilized to cool the thermally conductive members discussed above. Therefore, the spirit and scope of the appended claims should not be limited to the description of the preferred embodiments discussed above.

What is claimed is:

1. A magnetic resonance imaging magnet for examining a patient, comprising:
   (a) a first ferromagnetic pole piece and a second ferromagnetic pole piece, said pole pieces being disposed facing each other, defining a patient-receiving gap therebetween, and being arranged for producing a magnetic field within said patient-receiving gap, said pole pieces having a central axis extending through said pole pieces through said gap;
   (b) a ferromagnetic yoke for supporting said first pole piece and said second pole piece in their respective positions facing each other; and
   (c) first and second superconducting coil assemblies, each said assembly having:
      (i) an insulated vessel,
      (ii) at least one coil encircling the associated pole piece,
      (iii) at least one thermally conductive member mounted adjacent to said at least one coil,
      (iv) a first housing and a second housing for supporting the coil and being disposed within said vessel and surrounding said central axis so that said coil and said at least one thermally conductive member are enclosed within said first housing and said second housing;
   (d) a cryocooler for maintaining a cryogenic fluid,
   (e) said at least one thermally conductive member being in heat transfer relationship with said cryogenic fluid thereby cooling the at least one coil to a temperature at which said at least one coil exhibits superconducting properties and maintaining said at least one coil at a temperature at which said at least one coil exhibits superconducting properties so that no cryogenic fluid enters said first and second superconducting coil assemblies.

2. The magnet of claim 1, wherein the ferromagnetic yoke comprises a magnetic flux conduit for minimizing leakage magnetic fields.

3. The magnet of claim 1, wherein each said superconducting coil assembly includes a plurality of suspension members connected to said housing for restraining said superconducting coil assembly.

4. The magnet of claim 1, wherein each said housing includes at least one layer of superinsulation surrounding said at least one coil.

5. The magnet of claim 3, further comprising at least one heat shield within each said housing.

6. The magnet of claim 1, wherein said first housing has a U-shaped cross-section having an open side.

7. The magnet of claim 6, wherein said second housing has a U-shaped cross-section having an open side disposed facing said first housing open side.

8. The magnet of claim 7, further comprising a cryogenic fluid in said cryocooler.

9. The magnet of claim 1, wherein said at least one thermally conductive member includes at least one tube carrying a cryogenic fluid.

10. The magnet of claim 9, wherein said at least one thermally conductive member includes three tubes carrying a cryogenic fluid.

11. The magnet of claim 9, wherein said cryocooler is connected to said at least one tube for re-condensing the cryogenic fluid to a liquid phase.

12. The magnet of claim 1, wherein said cryogenic fluid comprises liquid helium.

13. The magnet of claim 1, wherein said at least one thermally conductive member comprises at least one strap comprised of a thermally conductive metal.

14. The magnet of claim 13, wherein said strap is comprised of aluminum having a purity of at least about 99%.

15. The magnet of claim 1, wherein:

(a) said vessel comprises an insulated vessel having a toroidal shape; and (b) said magnet further comprises a plurality of suspension members extending parallel to said central axis into said vessel for supporting said superconducting coil assembly, said suspension members being connected to said assembly at a first end thereof and at a second end thereof.

16. The magnet of claim 15 wherein said plurality of suspension members include tensioning devices accessible from said first end and said second end.

17. The magnet of claim 16, wherein said insulated vessel includes at least one layer of insulation, at least one heat shield and a space surrounding said first housing and said second housing and said magnet further comprises a bumper assembly for adjusting the position of said coil with respect to said central axis.

18. The magnet of claim 1, wherein said coil is mounted in said first housing so that said first housing is disposed on the inside of said coil with respect to said central axis.

19. The magnet of claim 18, wherein said at least one thermally conductive member is mounted in said second housing so that said second housing is disposed on the outside of said coil with respect to said central axis.

20. The magnet of claim 19, further comprising a member disposed between said coil and said thermally conductive member.

* * * * *